(12) United States Patent
Furukawa (10) Patent No.: US 7,436,112 B2
(45) Date of Patent: Oct. 14, 2008

(54) DISPLAY DEVICE ELEMENT SUBSTRATE AND METHOD OF MANUFACTURING THE SAME

(75) Inventor: Tadahiro Furukawa, Tokyo (JP)

(73) Assignee: Kyodo Printing Co., Ltd. (JP)

( * ) Notice: Subject to any disclaimer, the term of this patent is extended or adjusted under 35 U.S.C. 154(b) by 257 days.

(21) Appl. No.: 11/102,864

(22) Filed: Apr. 11, 2005

(65) Prior Publication Data

US 2005/0231108 A1    Oct. 20, 2005

(30) Foreign Application Priority Data

Apr. 14, 2004    (JP)    ............... 2004-118746

(51) Int. Cl.
*H05B 33/00*    (2006.01)
*H01J 5/16*    (2006.01)

(52) U.S. Cl. .............. 313/504; 313/112; 313/512; 349/69

(58) Field of Classification Search .......... None
See application file for complete search history.

(56) References Cited

U.S. PATENT DOCUMENTS

| 5,530,269 | A | * | 6/1996 | Tang ........................... 257/88 |
| 5,757,127 | A | * | 5/1998 | Inoguchi et al. ............. 313/507 |
| 6,838,828 | B2 | * | 1/2005 | Joo et al. ..................... 313/584 |
| 2002/0079832 | A1 | * | 6/2002 | Van Tongeren et al. ..... 313/504 |
| 2004/0119408 | A1 | * | 6/2004 | Ryu ............................ 313/512 |

FOREIGN PATENT DOCUMENTS

JP    2003-131199    5/2003

* cited by examiner

*Primary Examiner*—Ashok Patel
(74) *Attorney, Agent, or Firm*—Bacon & Thomas, PLLC (57) ABSTRACT

A display device element substrate of the present invention includes a plastic film, an adhesive layer formed on the plastic film, a transparent electrode which is formed on or over the adhesive layer and to which a display signal is supplied, and barrier insulating layer patterns formed on respective portions between patterns of a plurality of transparent electrodes, in addition, projection-like resin layers may be formed on the barrier insulating layer patterns.

18 Claims, 8 Drawing Sheets

FIG. 3 light emission

FIG. 4 light emission

DISPLAY DEVICE ELEMENT SUBSTRATE AND METHOD OF MANUFACTURING THE SAME

CROSS-REFERENCE TO RELATED APPLICATIONS

This application is based on and claims priority of Japanese Patent Application No. 2004-118746 filed on Apr. 14, 2004, the entire contents of which are incorporated herein by reference.

BACKGROUND OF THE INVENTION

1. Field of the Invention

The present invention relates to a display device element substrate and a method of manufacturing the same and, more particularly, a display device element substrate having various elements employed in an EL display device, a liquid crystal display device, or the like and a method of manufacturing the same.

2. Description of the Related Art

In recent years, the range of use of the display device such as the liquid crystal display device, the organic EL (Electroluminescence) display device, or the like is expanding rapidly to the information equipment, and so forth. In these display devices, the element substrate having various dot matrix elements corresponding to the simple matrix system or the active matrix system is employed. As the dot matrix element, the stripe-like transparent electrode is employed in the simple matrix system whereas the active element such as the TFT (Thin Film Transistor) element, the MIM (Metal Insulator Metal) element, or the like is employed in the active matrix system.

For the purpose of weight reduction, breakage prevention, et al., instead of the glass substrate, the plastic film may be employed as the base substrate of such element substrate. Since the plastic film has a small rigidity and a low heat deformation temperature, the thermal deformation such as bowing, expansion and contraction, or the like is ready to occur during the manufacturing process including the annealing.

For this reason, in the manufacturing method of forming directly the dot matrix elements, the color filter layers, etc. on the plastic film, conditions of the manufacturing steps including the annealing, etc. are restricted and also high-accuracy alignment becomes difficult. As a result, in some cases, the element substrate with desired characteristics cannot be manufactured.

In order to avoid such problem, there is the method of manufacturing the display device element substrate by forming the dot matrix elements, the color filter layers, etc. on the heat-resistant rigid glass substrate without any limitation of the manufacturing conditions in high-accuracy alignment to get the transfer layer, and then transferring/forming this transfer layer on the plastic film (for example, Patent Literature 1 (Patent Application Publication (KOKAI) 2003-131199)).

Meanwhile, in the organic EL element employed in the organic EL display device, the spot-like or circle-like non-emissive display defect called the dark spot is liable to occur because separation between the electrodes and the organic EL layer makes progress due to penetration of a water vapor, or the like.

In the above organic EL display device employing the plastic film as the substrate, measures are required to prevent the penetration of not only the water vapor entered from the outside air but also a moisture content contained in the plastic film itself into the organic EL element. Also, in the liquid crystal display device employing the plastic film as the substrate, there is a danger that the display characteristics are deteriorated similarly because the moisture content or the gas penetrates into the liquid crystal layer.

As the measure, it may be considered that a silicon nitride layer is formed on the whole surface of the plastic film on the element forming surface side as the barrier layer. However, a film thickness of the silicon nitride layer must be set relatively thick to secure the sufficient barrier property and the thick silicon nitride layer becomes colored. As a result, such a problem lies that the display characteristics of the display device are deteriorated.

In the above Patent Literature 1, no regard is paid to the problem that the display characteristics of the display device are deteriorated due to the penetration of the water vapor.

SUMMARY OF THE INVENTION

It is an object of the present invention to provide a display device element substrate capable of preventing a deterioration in the display characteristics caused due to penetration of a water vapor, or the like in the display device element substrate that employs a plastic film as a substrate, and a method of manufacturing the same.

The present invention is concerned with a display device element substrate, which comprises a plastic film; an adhesive layer formed on the plastic film; a transparent electrode which is formed over the adhesive layer and to which a display signal is supplied; and barrier insulating layer patterns formed on respective portions between patterns of a plurality of said transparent electrodes.

In case the display device element substrate of the present invention is applied to the organic EL display device, for example, the organic EL layers are formed on the transparent electrodes (anodes), then the upper electrodes (cathodes) are connected to the organic EL layers, and then the protection material is formed on the upper electrodes (cathodes).

As described above, the organic EL layers have such a characteristic that the display defect is ready to be caused due to the moisture content. In the. present invention, the transparent electrodes (ITO films) are formed under the organic EL layers and the barrier insulating layer patterns are formed besides the organic EL layers (on respective portions between the patterns of the transparent electrodes). The barrier insulating layer patterns act as the barrier layer that can block the penetration of outside air (water vapor) and the moisture content contained in the plastic film into the organic EL layers. Also, the transparent electrodes formed under the organic EL layers act as the barrier layer that can block the water vapor.

As a result, since the water vapor that enters into the organic EL layers from the lower side (from the outside air or the plastic film) can be blocked by the transparent electrodes and the barrier insulating layer patterns to leave no space, the deterioration of the organic EL layers caused due to the water vapor can be prevented.

Further, the barrier insulating layer patterns are not formed on the major portions (emitting portions) of the transparent electrodes. Therefore, even though the barrier insulating layer patterns are formed thick to get the sufficient barrier property and becomes colored, a high transmittance can be attained in the emitting portions and thus there is no possibility that the display characteristics are badly influenced.

Also, in case the color filter layers are arranged between the plastic film and the transparent electrodes, the barrier insulating layer patterns can also block the water vapor that enters into the organic EL layers from the color filter layers.

In the above present invention, preferably projection-like resin layers should be patterned on the barrier insulating layer patterns. In the case of this mode, since the projection-like resin layer is provided upright on the outer peripheral portions of the organic EL layers respectively, the projection-like resin layers can protect the organic EL layers from the impact or the contamination applied from the outside. Also, the projection-like resin layers can protect the barrier insulating layer patterns from the damage such as the crack, or the like caused due to the scratch or the stress.

As the transparent electrodes of the display device element substrate of the present invention, the pixel electrodes for the simple matrix driving may be employed or the pixel electrodes for the active matrix driving may be employed.

Further, the display device element substrate of the present invention may be employed as the element substrate of the liquid crystal display device. In the case of this mode, it can not only block the penetration of the moisture content into the liquid crystal layer but also function effectively as the gas barrier.

Also, the present invention is concerned with a method of manufacturing a display device element substrate, which comprises the steps of forming a peelable layer on a temporary substrate; forming a barrier insulating layer on or over the peelable layer; forming a transparent electrode, to which a display signal is supplied, on the barrier insulating layer; transferring/forming the transparent electrode, the barrier insulating layer, and the peelable layer on a plastic film via an adhesive layer in order from a bottom, by peeling along a boundary between the temporary substrate and the peelable layer; removing the peelable layer; and forming barrier insulating layer patterns on respective portions between patterns of the transparent electrode by patterning the barrier insulating layer.

In the present invention, the barrier insulating layer and the transparent electrodes to which the display signal is supplied are formed sequentially on the temporary substrate via the peelable layer, and then the transparent electrodes, the barrier insulating layer, and the peelable layer are transferred/formed on the plastic film in the state that they are upside down. Then, the peelable layer is removed, and then the barrier insulating layer patterns are formed by patterning the barrier insulating layer.

When using the manufacturing method of the present invention, the display device element substrate having such a structure that desired transparent electrodes and the barrier insulating layer patterns are formed on the plastic film can be manufactured easily without any disadvantage.

The color filter layers may be formed between the plastic film and the transparent electrodes.

As described above, in the display device element substrate using the plastic film as the substrate, the water vapor from the outside air or the plastic film can be blocked without any trouble and thus the deterioration in the display characteristics can be prevented.

DETAILED DESCRIPTION OF THE PREFERRED EMBODIMENTS

Embodiments of the present invention will be explained with reference to the accompanying drawings hereinafter.

First Embodiment

Figure 1A:
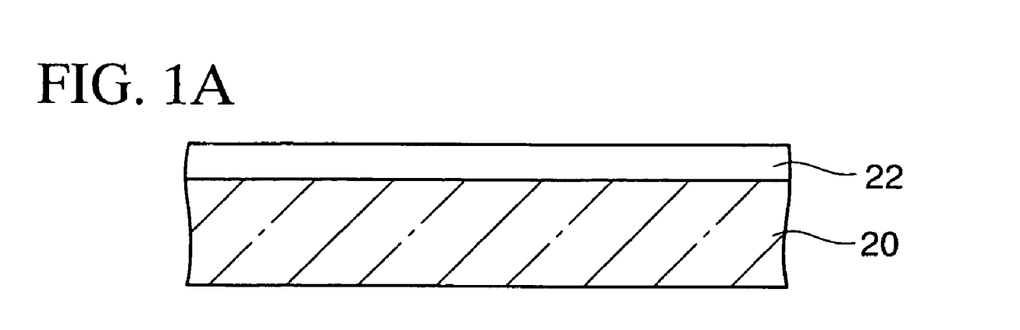
FIGS. 1A to 1N are sectional views showing a method of manufacturing a display device element substrate according to a first embodiment of the present invention.
Figure 1B:
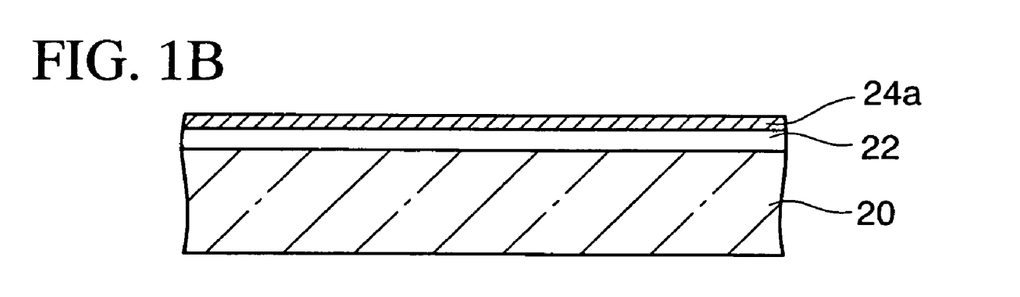
Figure 1C:
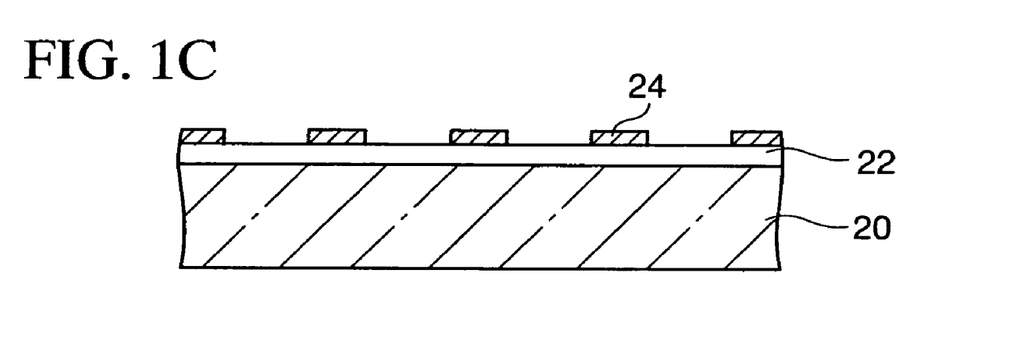
Figure 1D:
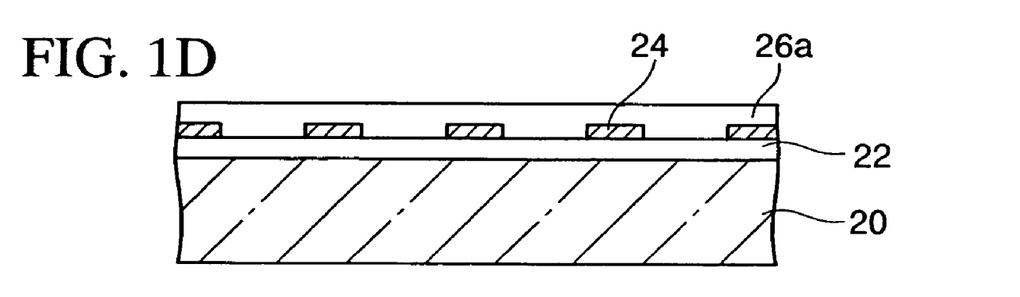
Figure 1E:
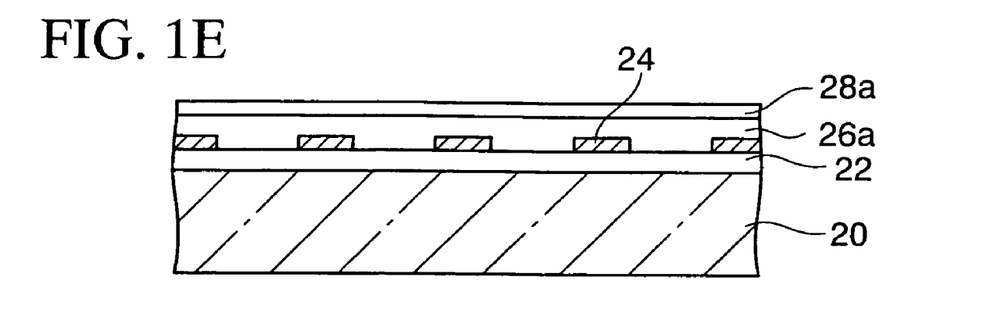
Figure 1F:
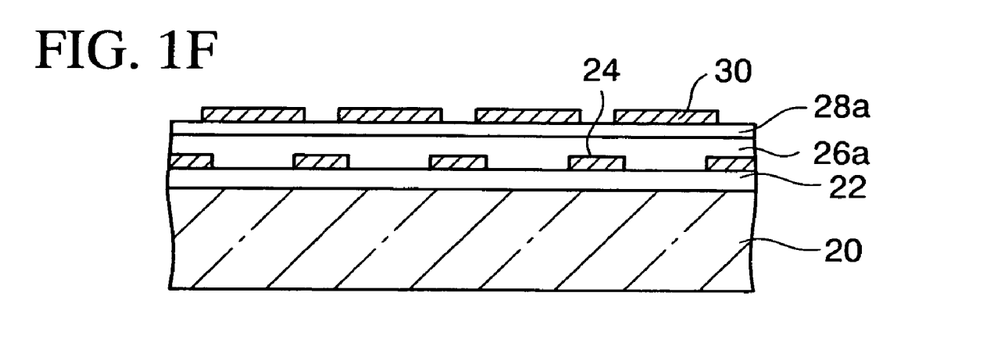
Figure 1G:
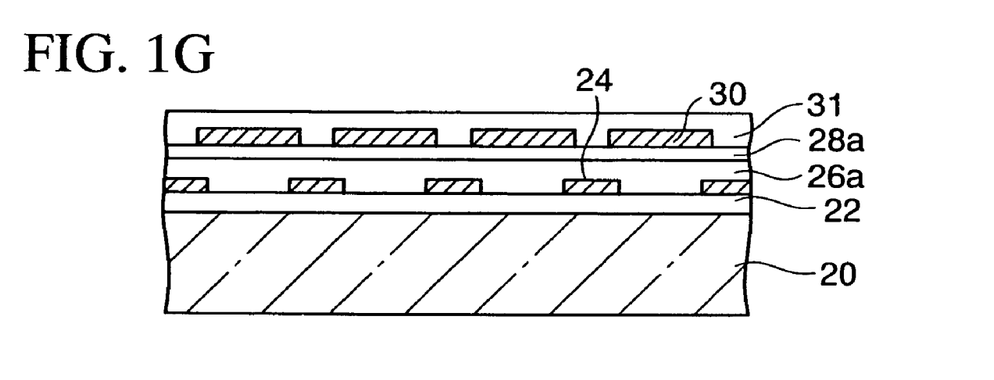
Figure 1H:
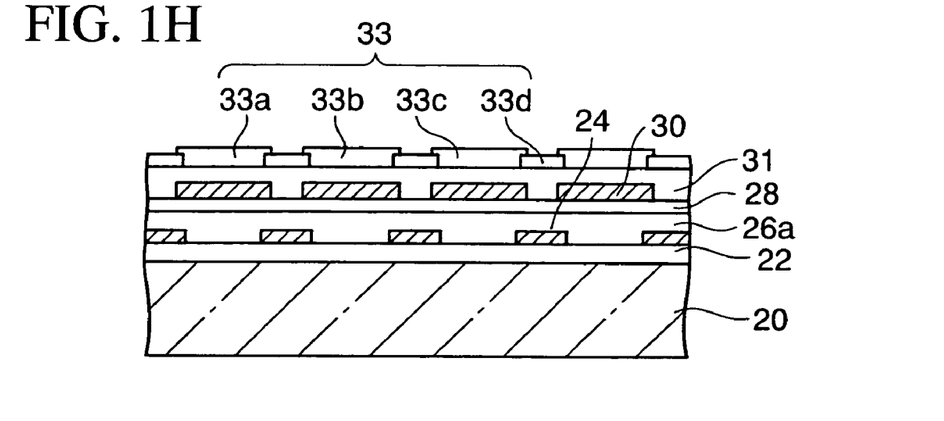
Figure 1I:
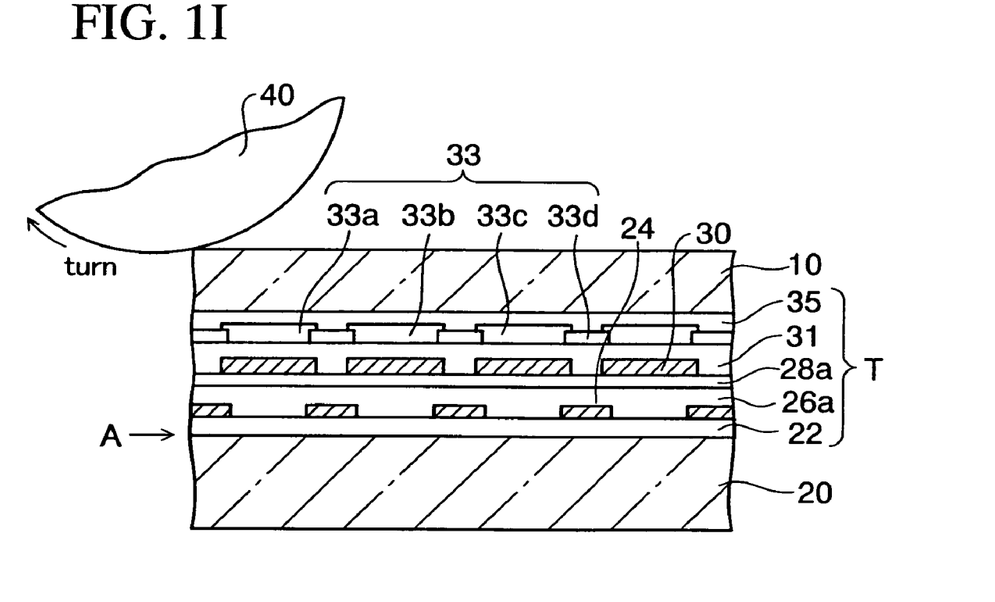
Figure 1J:
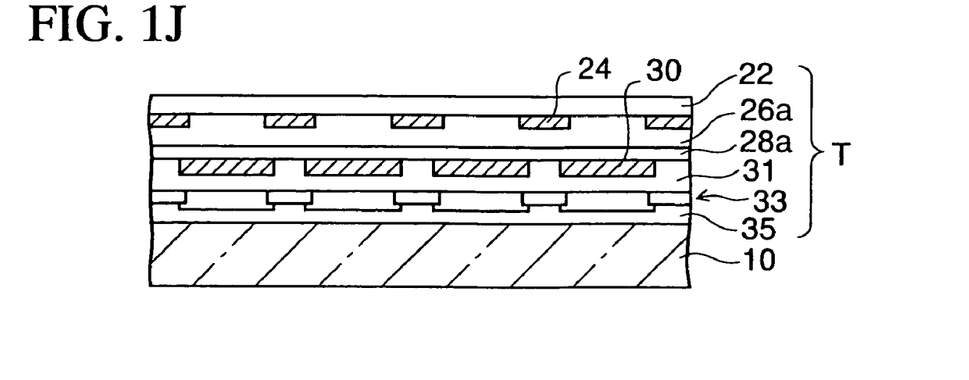
Figure 1K:
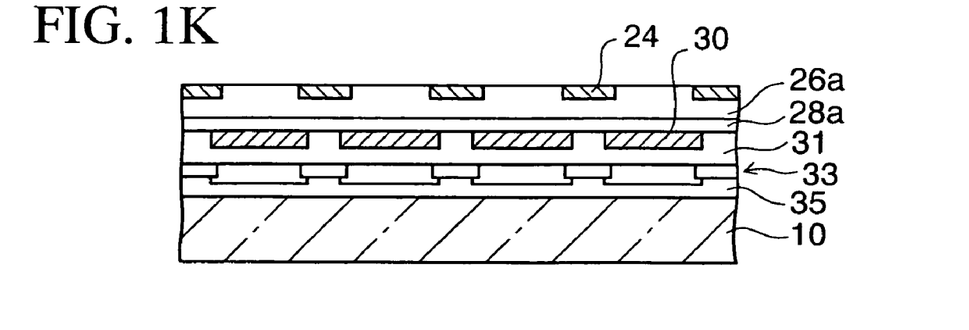
Figure 1L:
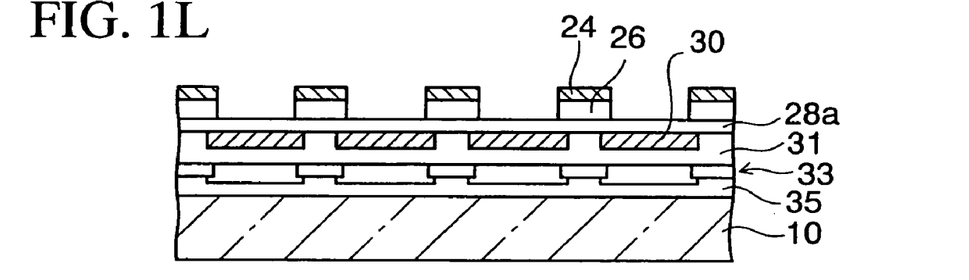
Figure 1M:
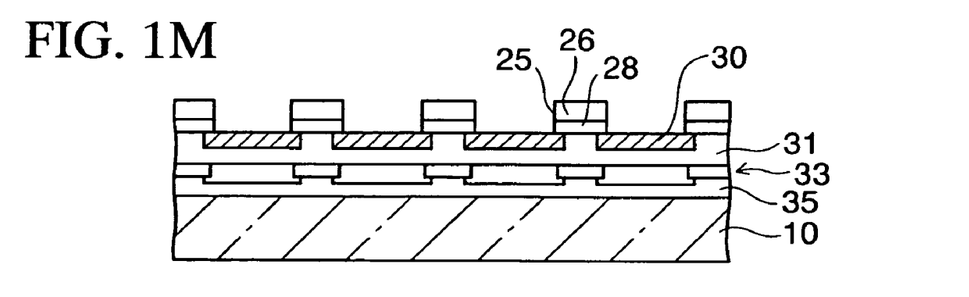
Figure 1N:
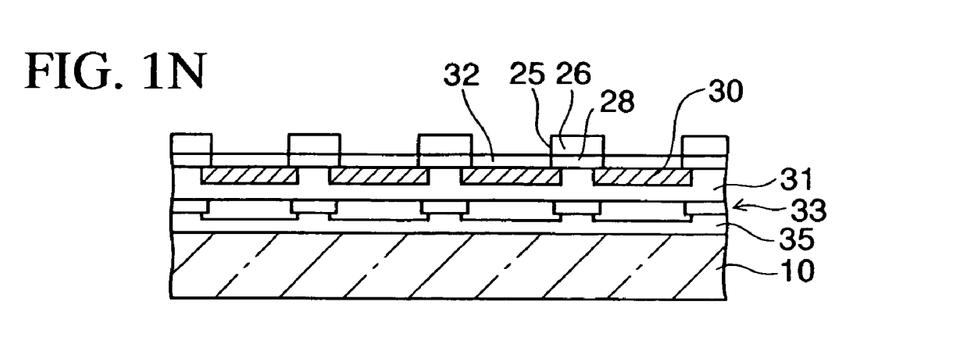
Figure 2:
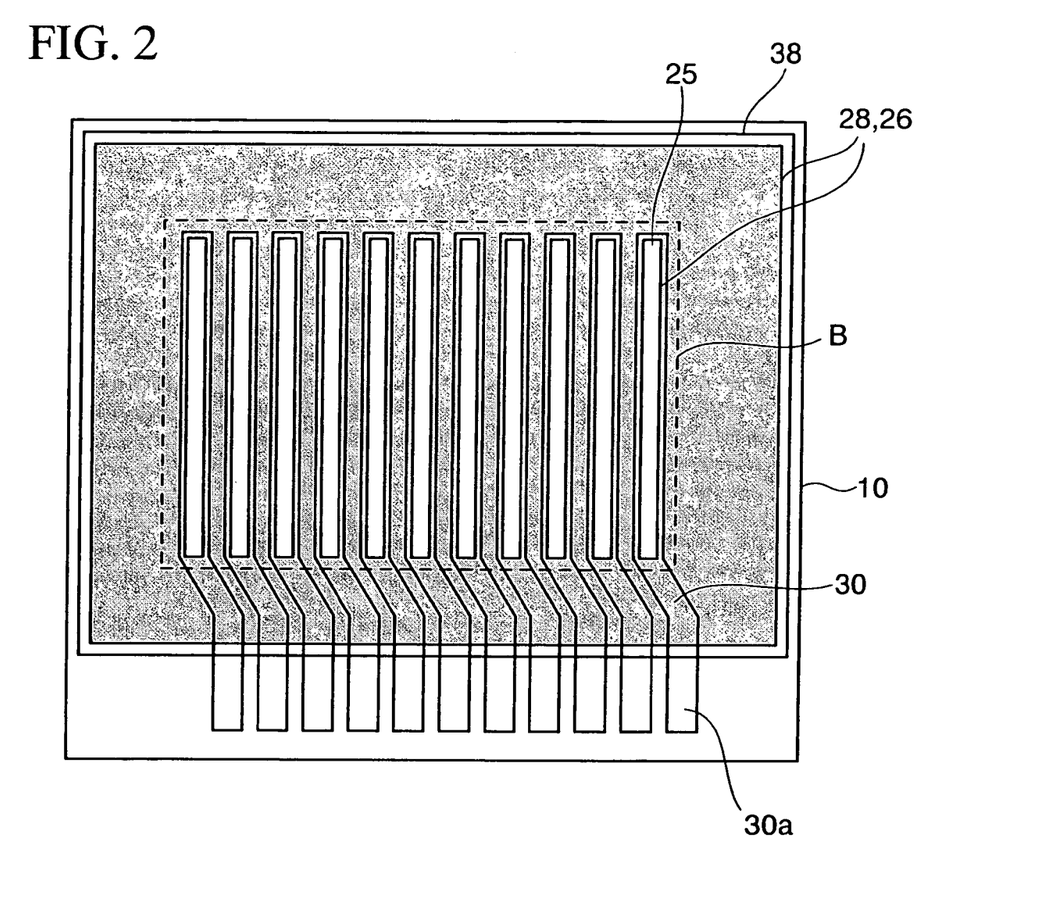
FIG. 2 is a plan view showing an overall appearance including FIG. 1M, when viewed along the planar direction.
Figure 3:
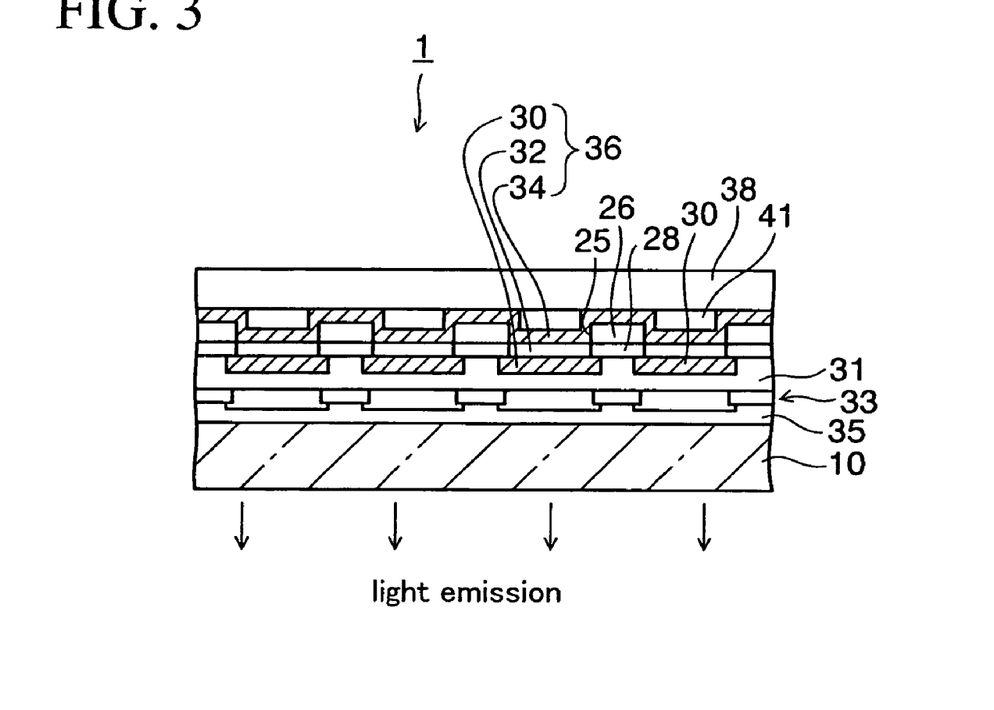
FIG. 3 is a sectional view showing the display device element substrate according to the first embodiment of the present invention.
Figure 4:
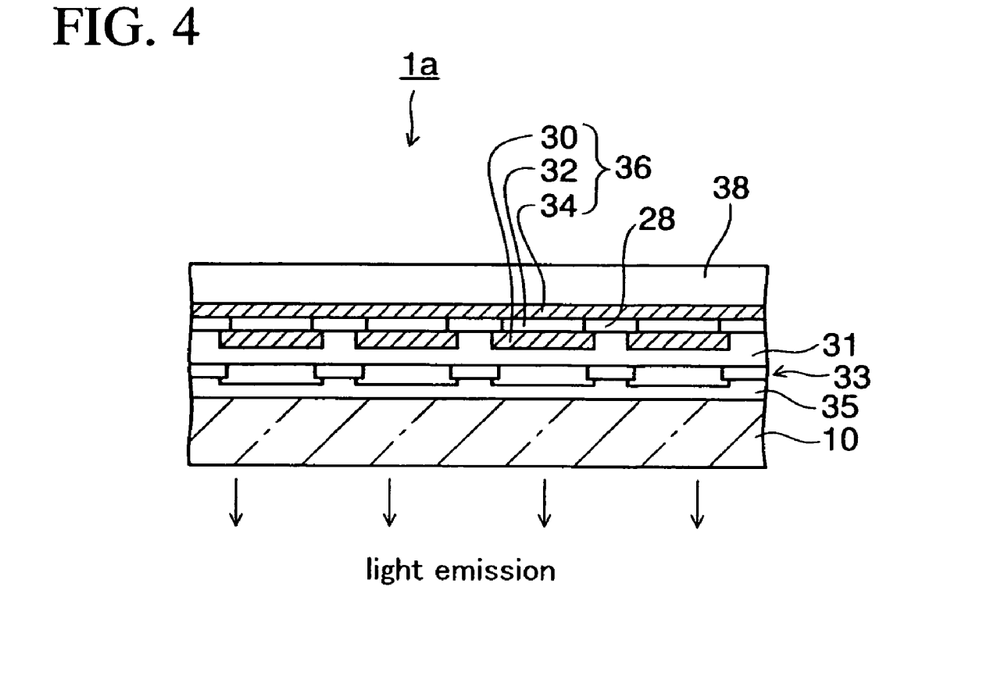
FIG. 4 is a sectional view showing a display device element substrate according to a variation of the first embodiment of the present invention.

FIGS. 1A to 1N are sectional views showing a method of manufacturing a display device element substrate according to a first embodiment of the present invention in sequence. FIG. 2 is a plan view showing an overall appearance including FIG. 1M, when viewed along the planar direction. FIG. 3 is a sectional view showing the display device element substrate according to the first embodiment of the present invention. FIG. 4 is a sectional view showing a display device element substrate according to a variation of the first embodiment of the present invention.

Next, explanation will be made of the element substrate applied to the organic EL display device by way of example of the display device element substrate in the present embodiment.

In the method of manufacturing the display device element substrate according to the first embodiment of the present invention, as shown in FIG. 1A, a glass substrate 20 (temporary substrate) such as a soda-lime glass having a heat resistance is prepared. Then, a peelable layer 22 made of a polyimide resin, a film thickness of which is about 4 μm, for example, or the like is formed on this glass substrate 20.

Then, as shown in FIG. 1B, a metal layer 24a made of aluminum (Al), silver (Ag), or the like is formed on the peelable layer 22 by the sputter, the vapor deposition, or the like. Then, as shown in FIG. 1C, mask metal layers 24 are formed by patterning the metal layer 24a by using the photolithography and the etching. At this time, the mask metal layers 24 are patterned on portions that correspond to respective positions between a plurality of anode patterns to be formed later.

Then, as shown in FIG. 1D, a resin layer 26a which is formed of a polyimide resin and whose film thickness is set to 1 to 2 μm, for example, is formed on the peelable layer 22 and the mask metal layers 24. Since the resin layer 26a is patterned later by using the mask metal layers 24 as a mask to form projection-like resin layers, its film thickness is adjusted appropriately to meet the characteristics of the organic EL display device.

Then, as shown in FIG. 1E, a barrier insulating layer 28a of a 50 to 300 nm thickness, for example, is formed on the resin layer 26a. As the barrier insulating layer 28a, an inorganic insulating layer formed of a silicon oxide layer ($SiO_x$), a silicon nitride layer ($SiN_x$), a silicon oxide nitride layer (SiON), or the like, which can block the penetration of the water vapor, is preferably employed. In this case, two layers or more may be selected from the $SiN_x$ layer, the $SiO_x$ layer, and the SiON layer and stacked. Otherwise, if the barrier insulating layer 28a is also used as a light shielding layer of the color filter layers described later, a black insulating layer capable of blocking the penetration of the water vapor may be employed.

Then, as shown in FIG. 1F, active elements (not shown) such as TFT elements, MIM elements, or the like, and anodes 30 (pixel electrode) made of ITO (Indium Tin Oxide) or IZO (Indium Zinc Oxide) and connected to thereto are formed on the barrier insulating layer 28a. The anodes 30 are formed on respective positions of the barrier insulating layer 28a, which correspond to areas between the patterns of the mask metal layers 24.

In the present embodiment, as the transparent electrodes (pixel electrodes) to which display signals are supplied, the active elements (not shown) and the anodes 30 connected thereto are illustrated. Although not particularly illustrated, in the case where the TFT elements are employed, first n-type poly-silicon layers that are patterned like an island are formed on the barrier insulating layer 28a. Then, a gate insulating film is formed on the poly-silicon layers, and then a gate electrode formed of an Al film, or the like is formed on the gate insulating films. Then, source portions and drain portions are formed by introducing the p-type conductivity type impurity while using the gate electrodes as a mask, so that p-channel TFT elements are obtained. Then, the above anodes 30 are connected electrically to the source portions of the TFT elements.

In the case where the display device element substrate of the simple matrix type is manufactured, the anodes 30 are formed as the stripe-like transparent electrodes (pixel electrodes) for the simple matrix driving.

Because the ITO film constituting the anode 30 is formed on the heat-resistant glass substrate 20, the sputter method that needs a film forming temperature of about 200° C., or the like can be employed. For this reason, the crystalline ITO film having a low resistance (sheet resistance value: 10 to 15 Ω/□ (film thickness: 130 nm)) can be obtained. As described later, the anode 30, and the like are transferred/formed finally onto the flexible plastic film. Since films formed on the plastic film are easily scratched, to use the crystalline and hard anode 30 (ITO film) has advantage also from the viewpoint that the anodes 30 are made hard to be scratched.

Then, as shown in FIG. 1G, a protection film 31 made of an acrylic resin, or the like and having a film thickness of 2 to 5 μm is formed on an upper surface of the resultant structure in FIG. 1F. As a result, a level difference between the active elements and the anodes 30 connected thereto is filled with the protection film 31, and the upper surface is made flat.

In the present embodiment, since the EL display device of the type that the color display is performed by employing the color filter layers in combination with the white emitting layer, which is employed as the organic EL layer, is illustrated, color filter layers 33 are formed in compliance with following steps. In more detail, as shown in FIG. 1H, first light shielding layers 33d are patterned on the protection film 31 over the areas between patterns of the anodes 30. Then, red color filter layers 33a are patterned in portions constituting the red color pixel portions. Then, green color filter layers 33b are patterned in portions constituting the green color pixel portions. Then, blue color filter layers 33c are patterned in portions constituting the blue color pixel portions.

In this fashion, the color filter layers 33 composed of the red color filter layers 33a, the green color filter layers 33b, the blue color filter layers 33c, and the light shielding layers 33d are formed. Respective color filter layers 33a to 33d are formed by patterning the pigment-dispersed type photosensitive coating film, for example, by means of the photolithography.

In this case, when three-color emitting layers in red, green, and blue colors are employed as the organic EL layer, it is no necessity to form the color filter layers 33.

Then, as shown in FIG. 1I, an adhesive layer 35 containing an ultraviolet curing type resin as a principal component is formed on the color filter layers 33. Accordingly, a transfer layer T constructed by the peelable layer 22, the mask metal layers 24, the resin layer 26a, the barrier insulating layer 28a, the anodes 30 (or the stripe-like transparent electrodes) connected to the active elements, the protection film 31, the color filter layers 33, and the adhesive layer 35 in order from the bottom is formed on the glass substrate 20.

In this case, when the color filter layers 33 are omitted, the protection film 31 may not be formed and the active elements and the anodes 30 (the transparent electrodes) may be buried in the adhesive layer 35.

Then, a method of transferring the transfer layer T formed on the glass substrate 20 onto the plastic film will be explained hereunder. Then, as also shown in FIG. 1I, first a plastic film 10 which corresponds to the size of the glass substrate 20 is prepared. As the plastic film 10, a polyethersulfone film, a polycarbonate film, or the like having a film thickness of 100 to 200 μm can be employed.

Then, the plastic film 10 is opposed to a surface of on the adhesive layer 35 side of the transfer layer T, and then placed in piles on the adhesive layer 35. The ultraviolet rays is irradiated onto the adhesive layer 35 by the high-pressure mercury lamp from the plastic film 10 side, and thus the adhesive layer 35 that is the ultraviolet curing type resin is cured. As a result, the plastic film 10 and the transfer layer T are pasted together. At this time, the level differences between the color filter layers 33 are buried with the adhesive layer 35 to planarize the surface.

Then, as also shown in FIG. 1I, a roller 40 having a diameter of about 200 mm is fixed to one end of the plastic film 10, and then the plastic film 10 is peeled while turning this roller 40. At this time, the plastic film 10 is peeled along the boundary (A portion indicated in FIG. 1I) between the glass substrate 20 and the peelable layer 22.

As a consequence, as shown in FIG. 1J, the transfer layer T constructed by the adhesive layer 35, the color filter layers 33, the protection film 31, the anodes 30 (or the stripe-like transparent electrodes) connected to the active elements, the barrier insulating layer 28a, the resin layer 26a, the mask metal layers 24, and the peelable layer 22 in order from the bottom is transferred/formed on the plastic film 10.

In this manner, in the present embodiment, the approach of forming the transfer layer T including various desired elements on the heat-resistant rigid glass substrate 20 with good precision and then transferring/forming the transfer layer T on the plastic film 10 is employed. Therefore, various desired elements can be formed on the plastic film 10 with high alignment precision.

Then, as shown in FIG. 1K, the peelable layer 22 formed over the plastic film 10 is removed by the etching using the oxygen plasma, the choline-series alkali solution, or the like. As a result, the mask metal layers 24 and the resin layer 26a are exposed from the uppermost surface of the plastic film 10.

Then, as shown in FIG. 1L, the resin layer 26a is etched by using the mask metal layers 24 as a mask until an upper surface of the barrier insulating layer 28a is exposed, and thus projection-like resin layers 26 are formed. In case the polyimide resin is employed as the resin layer 26a, such resin layer 26a is etched selectively with respect to the mask metal layers 24 and the barrier insulating layer 28a by using the oxygen plasma, the choline-series alkali solution, or the like.

Then, as shown in FIG. 1M, the barrier insulating layer 28a is etched by using the mask metal layers 24 and the projection-like resin layers 26 as a mask until the upper surfaces of the anodes 30 are exposed, and thus barrier insulating layer patterns 28 are formed. In case the $SiN_x$ layer is used as the barrier insulating layer 28a, such barrier insulating layer 28a is etched selectively by the $CF_4$ plasma or the buffered hydrofluoric acid.

Then, the mask metal layers 24 are removed selectively with respect to the projection-like resin layers 26, the barrier insulating layer patterns 28, and the anodes 30. In case the Al layer is used as the mask metal layer, the wet etching using a solution containing a phosphoric acid is employed.

According to this, the barrier insulating layer patterns 28 and the projection-like resin layers 26 are formed on portions between the patterns of a plurality of anodes 30. That is, the barrier insulating layer 28a and the resin layer 26a are patterned such that opening portions 25 are formed on the anodes 30.

An overall appearance including FIG. 1M when viewed along the planar direction is shown in FIG. 2. For the purpose of simplifying the explanation, the stripe-like anodes 30 corresponding to the simple matrix type is illustrated in FIG. 2, and one end side of the anode 30 is coupled to an external connection portion 30a. An area in which a plurality of stripe-like anodes 30 are placed serves as a display area B (area surrounded by a chain line). Then, the barrier insulating layer patterns 28 and the projection-like resin layers 26 are formed not only on respective portions between the patterns of the anodes 30 in a state that the opening portions 25 are provided on the anodes 30 in the display area B respectively but also on the overall major portion of the display device element substrate except the external connection portions 30a.

Preferably, as shown in FIG. 2, the barrier insulating layer patterns 28 and the projection-like resin layers 26 are formed to extend from the portions between the patterns of the anodes 30 to an area in which a protection film 38 formed later is arranged (shaded portion in FIG. 2). Also, the opening portions 25 are formed to have a width that is smaller than a width of the stripe-like anode 30 respectively. Here, in case the display device is of the active matrix type, the opening portions 25 are formed to have an area that is smaller than an area of the anode 30 (pixel electrode) respectively.

As described later, the barrier insulating layer patterns 28 are formed from the portions between the patterns of the anodes 30 to an outer peripheral portion. Therefore, the water vapor that enters from the lower side can be blocked perfectly by the anodes 30 and the barrier insulating layer patterns 28. This is because the anodes 30 made of ITO can also function as the barrier layer to block the water vapor and thus a clearance through which the water vapor enters can be eliminated.

In addition, even though a film thickness of the barrier insulating layer pattern 28 is made thick enough to provide a sufficient barrier property and thus the barrier insulating layer pattern 28 becomes colored, the display characteristics are by no means impaired, because the barrier insulating layer pattern 28 is not formed on the anodes 30 (emitting portions) but, rather, in the areas between the annodes 30.

In this case, the projection-like resin layers 26 are not always formed. In case the projection-like resin layers 26 are omitted, the barrier insulating layer 28a may be formed directly on the mask metal layers 24 and then the barrier insulating layer 28a may be patterned by using the mask metal layers 24 as a mask. Otherwise, in case the mask metal layers 24 are further omitted, the barrier insulating layer 28a may be formed immediately after the peelable layer 22 is formed and then the barrier insulating layer 28a may be patterned by the photolithography.

Then, as shown in FIG. 1N, organic EL layers 32 are obtained by forming sequentially a hole transporting layer, a white emitting layer, and an electron transporting layer on the anodes 30, which are exposed via the opening portions 25, by virtue of the printing, or the like. At this time, the organic EL layer 32 is formed on respective bottom portions of the opening portions 25 of the barrier insulating layer patterns 28 and the projection-like resin layers 26, and the projection-like resin layer 26 is arranged on the outer peripheral portion of the organic EL layer 32.

Then, as shown in FIG. 3, a cathode 34 (upper electrode) connected to the organic EL layers 32 is formed on the overall surface of the element forming portion. Here, in case the display device is of the simple matrix type, stripe-like cathodes (upper electrodes) are formed to intersect orthogonally with the stripe-like anodes 30 (transparent electrodes). In this manner, organic EL elements 36 each having the structure that the organic EL layer 32 is put between the anode 30 and the cathode 34 are formed.

Then, as also shown in FIG. 3, the protection film 38 (protection material) is adhered onto the cathode 34. The protection film 38 is provided to prevent the deterioration of the organic EL elements 36 caused by the oxidizing atmosphere or the water vapor entered from the outside. As described above and shown in FIG. 2, the protection film 38 is formed in the regions containing the portions in which the barrier insulating layer patterns 28 and the projection-like resin layers 26 are formed.

In the present embodiment, since the projection-like resin layer 26 is formed to surround the organic EL layer 32, the structure capable of preventing a direct contact between the organic EL layers 32 and the protection film 38 can be realized. Therefore, since the organic EL layers 32 are protected by the projection-like resin layers 26 when the protection film 38 is subjected to the impact from outside, the damage of the organic EL layers 32 can be prevented.

Also, since the projection-like resin layers 26 are formed on the barrier insulating layer patterns 28 respectively, the barrier insulating layer patterns 28 can be protected not to cause the damage such as the crack, or the like therein due to the scratch or the stress.

In this event, spaces 41 between the projection-like resin layers 26 may be filled with the adhesive layer or may be a cavity.

With the above, a display device element substrate 1 (organic EL display device) according to the first embodiment is completed.

In the display device element substrate 1 of the present embodiment, a positive voltage is applied to the anode 30 of the organic EL elements 36 and also a negative voltage is applied to the cathode 34, and thus holes injected from the anode 30 via the hole transporting layer and electrons injected from the cathode 34 via the electron transporting layer are recombined in the inside of the organic EL layers 32, so that the white light is emitted. Then, this white light is transmitted through the color filter layers 33, etc. and is emitted to the outside, and thus the image can be obtained (direction indicated with an arrow in FIG. 3).

In the display device element substrate 1 of the present embodiment, as shown in FIG. 3, the adhesive layer 35 is provided on the plastic film 10 and then the color filter layers 33 are buried in the adhesive layer 35. Also, the protection layer 31 is formed on the color filter layers 33 and then the anodes 30 made of ITO are buried in the protection layer 31. The organic EL layers 32 are formed on the anodes 30 and then the cathode 34 is formed on the organic EL layers 32 in the overall surface of the element forming portion. The organic EL element 36 is composed of the anode 30, the organic EL layer 32, and the cathode 34. Then, the protection film 38 is provided on the cathodes 34 of the organic EL elements 36.

The display device element substrate 1 of the present embodiment includes the constitution in which the barrier insulating layer patterns 28 and the projection-like resin layers 26 are patterned on portions between the patterns of the anodes 30 and also the opening portions 25 are provided on the anodes 30.

Also, in the display device element substrate 1 of the present embodiment, the anodes 30 made of ITO are formed under the organic EL layer 32 and also the barrier insulating layer patterns 28 are formed besides the organic EL layers 32 (on the portions between the patterns of the anodes 30). The barrier insulating layer patterns 28 act as the barrier layer that can block the penetration of the water vapor into the organic EL layers 32 from the outside air or the plastic film 10. Also, the anodes 30 (ITO films) formed under the organic EL layers 32 act as the barrier layer that can block the water vapor.

As a result, since the water vapor that enters into the organic EL layers 32 from the lower side (from the outside air or the plastic film) can be blocked perfectly by the anodes 30 and the barrier insulating layer patterns 28, the deterioration of the organic EL layers 32 caused due to the water vapor can be prevented.

Further, the barrier insulating layer patterns 28 are not formed on the major portions (emitting portions) of the anodes 30. Therefore, even though the barrier insulating layer patterns 28 are formed thick to get the sufficient barrier property and become colored, a high transmittance can be attained in the emitting portions and thus there is no possibility that the display characteristics are badly influenced.

Also, the anodes 30 and the barrier insulating layer patterns 28 are formed just under and besides the organic EL layers 32. Therefore, even when the color filter layers 33 and the protection layer 31 contain the moisture content, the water vapor entering from these layers can also be blocked.

Also, the projection-like resin layer 26 is provided upright on the outer peripheral portions of the organic EL layers 32. Therefore, even when the protection film 38 is subjected to an external impact, the organic EL layers 32 are protected by the projection-like resin layers 26. As a result, the organic EL layers 32 are hard to be damaged and the reliability of the organic EL display device can be improved.

In addition, since the barrier insulating layer patterns 28 are also protected by the projection-like resin layers 26, it can be prevented that the damage such as the crack, or the like due to the scratch or the stress is caused in the barrier insulating layer patterns 28.

Next, a display device element substrate 1a (organic EL display device) according to a variation of the present embodiment is shown in FIG. 4. In the display device element substrate 1a according to this variation, the projection-like resin layers 26 are omitted and the protection film 38 is adhered onto the cathode 34 of the organic EL elements 36 via the adhesive layer (not shown). Since remaining elements are identical to those in FIG. 3, their explanation will be omitted herein. In the second display device element substrate 1a, the anodes 30 and the barrier insulating layer patterns 28 are also formed just under and besides the organic EL layers 32 respectively. Therefore, the deterioration of the organic EL layers 32 caused due to the water vapor that penetrates from the lower side can be prevented.

Second Embodiment

Figure 5:
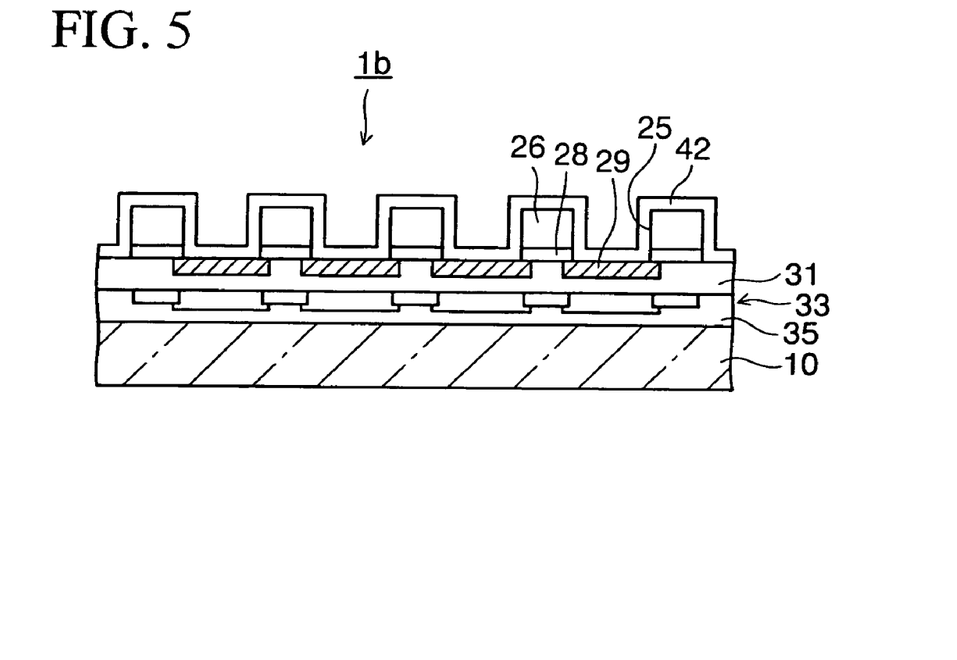
FIG. 5 is a sectional view showing a display device element substrate according to a second embodiment of the present invention.
Figure 6:
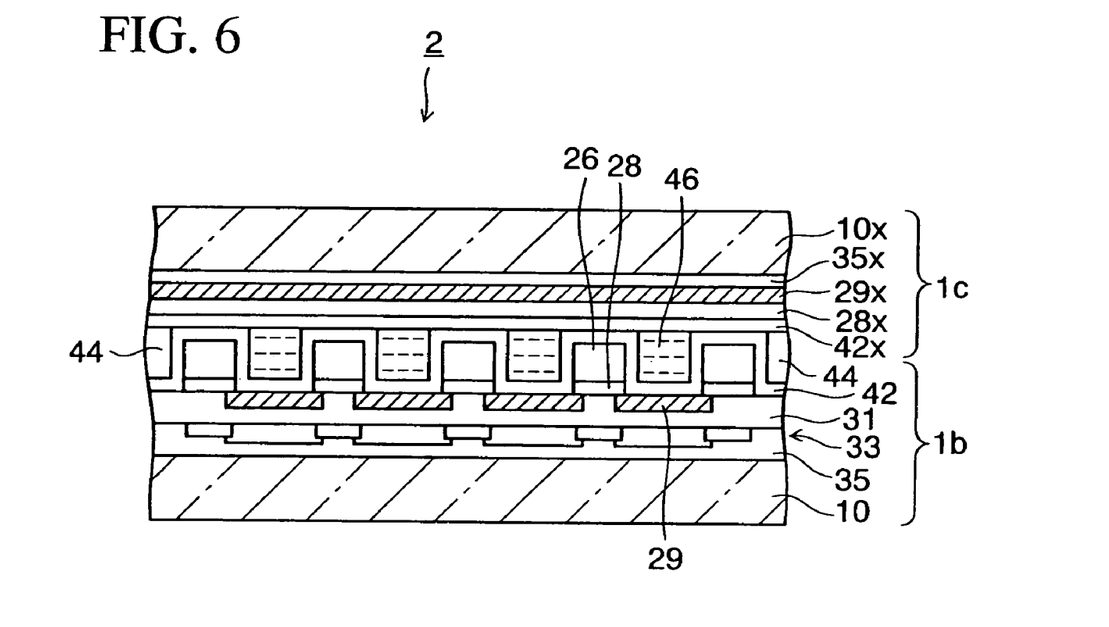
FIG. 6 is a sectional view showing a liquid crystal display device constructed by employing the display device element substrate shown in FIG. 5.
Figure 7:
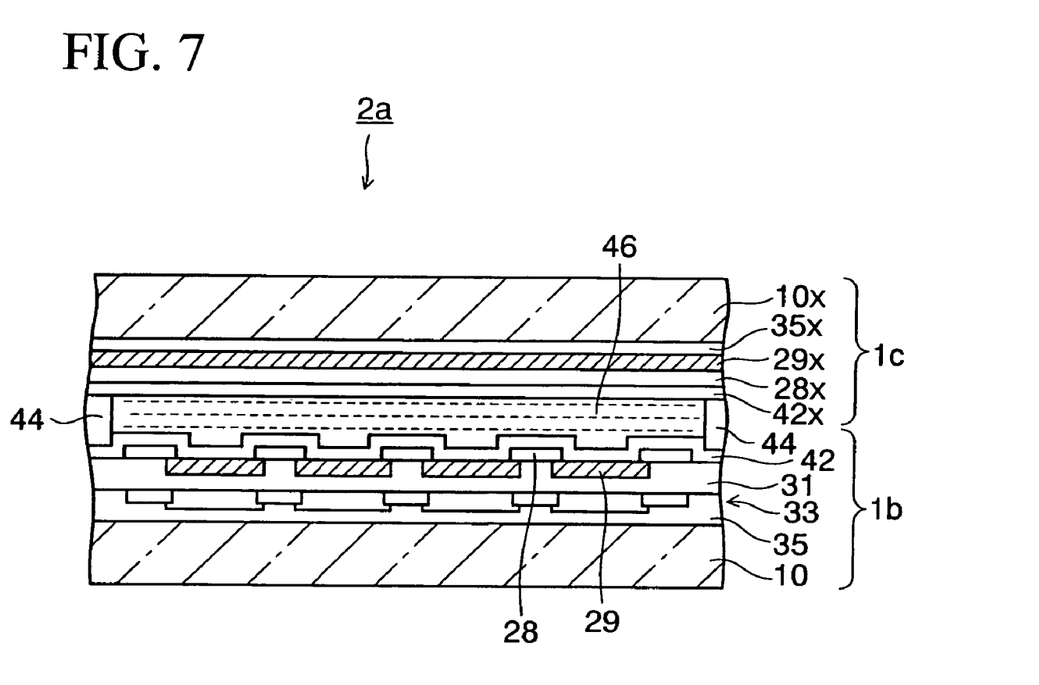
FIG. 7 is a sectional view showing a liquid crystal display device according to a variation of the second embodiment of the present invention.

FIG. 5 is a sectional view showing a display device element substrate according to a second embodiment of the present invention. FIG. 6 is a sectional view showing a liquid crystal display device constructed by employing the display device element substrate shown in FIG. 5. FIG. 7 is a sectional view showing a liquid crystal display device according to a variation of the second embodiment of the present invention.

A first display device element substrate 1b shown in FIG. 5 in the second embodiment is basically constructed similarly to the structural body explained in the first embodiment and shown in FIG. 1M. That is, as shown in FIG. 5, the adhesive layer 35 is provided on the plastic film 10 and also the color filter layers 33 are buried in the adhesive layer 35. The protection layer 31 is formed on the color filter layers 33 and also stripe-like transparent electrodes 29 made of ITO are buried in the protection layer 31.

The barrier insulating layer patterns 28 and the projection-like resin layers 26 are patterned on respective portions between patterns of a plurality of transparent electrodes 29, and the opening portions 25 are provided on the transparent electrodes 29. Then, an alignment film 42 used to align the liquid crystal material is formed on the transparent electrodes 29 and the projection-like resin layers 26.

In the example in FIG. 5, the stripe-like transparent electrodes applied to the simple matrix type are illustrated as the transparent electrodes 29. But the transparent electrodes applied to the active matrix type in which such electrodes are connected to the TFT elements or the MIM elements may be employed.

In the second embodiment, the projection-like resin layers 26 serve as spacers that secure an interval between two element substrates in the liquid crystal display device. A height of the projection-like resin layers 26 can be adjusted appropriately in response to the interval between two element substrates in the liquid crystal display device, and is set to 10 to 100 µm, for example.

Then, as shown in FIG. 6, a second display device element substrate 1c used as an opposing substrate of the first display device element substrate 1b is prepared. In the second display device element substrate 1c, an adhesive layer 35x, transparent electrodes 29x, and barrier insulating layer patterns 28x are formed sequentially on a plastic film 10x. Like the first display device element substrate 1b, the barrier insulating layer patterns 28x are formed on respective portions between the patterns of a plurality of transparent electrodes 29x, or the like. Then, an alignment film 42x used to align the liquid crystal material is formed on the transparent electrodes 29x and the barrier insulating layer patterns 28x.

The first display device element substrate 1b and the second display device element substrate 1c are arranged such that respective transparent electrodes 29, 29x intersect orthogonally with each other, and are adhered mutually by a sealing member 44 provided to the peripheral portion. Then, a liquid crystal layer 46 is sealed between the first display device element substrate 1b and the second display device element substrate 1c.

A liquid crystal display device 2 is constructed in this manner, and an interval between the first and second display device element substrates 1b, 1c is maintained by the projection-like resin layers 26 in the first display device element substrate 1b.

In the liquid crystal display device 2 according to the present embodiment, the interval between the first and second display device element substrates 1b, 1c is secured by the projection-like resin layers 26. Therefore, the liquid crystal display device can stand up to the external pressure rather than the device obtained by applying the method of keeping the interval by scattering the spacers in the prior art can be manufactured.

Also, the barrier insulating layer patterns 28, 28x are formed on the portions between the patterns of a plurality of transparent electrodes 29, 29x in the first and second display device element substrates 1b, 1c respectively. Therefore, the moisture content or the gas entered from the outside air and the plastic films 10, 10a can be blocked by the transparent electrodes 29, 29x and the barrier insulating layer patterns 28, 28x. As a result, it can be prevented that the moisture content or the gas is transmitted into the liquid crystal layer 46, and also the reliability of the display characteristics of the liquid crystal display device can be improved. Like the first embodiment, the barrier insulating layer patterns 28, 28x may be formed not only on the display area but also on the outer peripheral portion.

In this case, instead of providing the color filter layers 33 in the first display device element substrate 1b, such a mode may be employed that the color filter layers are provided between the transparent electrodes 29x and the adhesive layer 35x, for example, in the second display device element substrate 1c.

Next, a liquid crystal display device 2a according to a variation of the second embodiment is shown in FIG. 7. As shown in FIG. 7, the liquid crystal display device 2a according to the variation of the second embodiment shows such a mode that the projection-like resin layers 26 are omitted from the liquid crystal display device 2 in FIG. 6, and the interval between the first and second display device element substrates 1b, 1c is maintained by the spacers (not shown). Since remaining elements in FIG. 7 are identical to those in FIG. 6, their explanation will be omitted by affixing the same reference symbols to the same elements.

In the liquid crystal display device 2a of the variation shown in FIG. 7, moisture and gas is prevented from being transmitted into the liquid crystal layer 46, and deterioration of the display characteristics is thereby prevented.

As described above, respective modes in which the display device element substrate is applied to the organic EL display device and the liquid crystal display device are exemplified according to the first and second embodiment, but this display device element substrate may be applied to other various display devices. Also, as the transparent electrode to which the display signal is supplied, the stripe-like pixel electrodes corresponding to the simple matrix type or the pixel electrodes corresponding to various three-terminal type elements such as the TFT element, etc. or various two-terminal type elements such as the MIM element, etc. corresponding to the active matrix type can be employed.

What is claimed is:

1. A display device element substrate comprising:
   a plastic film;
   an adhesive layer formed on the plastic film, the adhesive layer having a first surface in contact with the plastic film and a second surface opposite the first surface;
   a plurality of spaced transparent electrodes with spaces therebetween, formed on the second surface of the adhesive layer, and to which a display signal is supplied; and
   a patterned layer of barrier insulating elements covering the spaces but not covering major portions of surface areas of the plurality of transparent electrodes.

2. A display device element substrate according to claim 1, further comprising a patterned resin layer of spacer projections formed over the patterned layer of barrier insulating layer elements.

3. A display device element substrate according to claim 1, further comprising:
   a protection layer formed between the adhesive layer and the transparent electrodes;
   wherein the transparent electrodes are buried in the protection layer.

4. A display device element substrate according to claim 3, further comprising:
   a layer of color filters formed between the adhesive layer and the protection layer;
   wherein the color filters are buried in the adhesive layer.

5. A display device element substrate according to claim 1, wherein the transparent electrodes are strips forming a pixel electrode for a simple matrix driving or a pixel electrode for an active matrix driving.

6. A display device element substrate according to claim 1, further comprising:
   an organic EL layer formed on the plurality of transparent electrodes; and
   an upper electrode connected to the organic EL layer.

7. A display device element substrate according to claim 2, further comprising:
   an organic EL layer formed on the plurality of transparent electrodes;
   an upper electrode connected to the organic EL layer; and
   a protective layer formed on the upper electrode;
   wherein the spacer projections extend further from the plastic film than the organic EL layer.

8. A display device element substrate according to claim 1, wherein the major portions of the surface areas of the plurality of transparent electrodes define a display area and wherein the patterned layer of barrier insulating elements surrounds the display area, in addition to covering the spaces between the transparent electrodes.

9. A display device element substrate according to claim 1, wherein the transparent electrodes are made of ITO or IZO, and the patterned layer of barrier insulating elements is formed of any one of silicon oxide, silicon nitride, and silicon oxide nitride or stacked films thereof.

10. A liquid crystal display device comprising a display device element substrate according to claim 1.

11. A liquid crystal display device comprising two display device element substrates according to claim 2, wherein the spacer projections function as spacers between the two substrates.

12. A method of manufacturing a display device element substrate according to claim 1, comprising the steps of:
   forming a peelable layer on a temporary substrate;
   forming a barrier insulating layer on or over the peelable layer;
   forming the plurality of transparent electrodes, to which a display signal is supplied, on the barrier insulating layer;
   forming an adhesive layer over the plurality of transparent electrodes;
   transferring the adhesive layer, the plurality of transparent electrodes, the barrier insulating layer, and the peelable layer onto a plastic film via the adhesive layer;
   peeling off the temporary substrate along a boundary between the temporary substrate and the peelable layer;
   removing the peelable layer; and
   patterning the barrier insulating layer.

13. A method of manufacturing a display device element substrate according to claim 12, after the step of forming the peelable layer, further comprising:
  forming a metal masking layer on the peelable layer;
  patterning the metal masking layer;
  wherein the adhesive layer, the plurality of transparent electrodes, the barrier insulating layer, the metal masking layer, and the peelable layer are transferred onto the plastic film via the adhesive layer and the step of patterning the barrier insulating layer is carried out by using the metal masking layer as a mask; and
  removing the metal masking layer after the step of patterning the barrier insulating layer.

14. A method of manufacturing a display device element substrate according to claim 12, after the step of forming the peelable layer, further comprising the steps of:
  forming a metal masking layer on the peelable layer;
  patterning the metal masking layer;
  forming a resin layer covering the patterned metal masking layer;
  wherein the plurality of transparent electrodes, the barrier insulating layer, the resin layer, the patterned metal masking layer, and the peelable layer are transferred onto the plastic film via the adhesive layer;
  sequentially patterning the resin layer and the barrier insulating layer, using the metal masking layer as a mask, to form the patterned resin layer of spacer projections and the patterned layer of barrier insulating elements; and
  removing the metal masking layer, after the step of forming the patterned layer of barrier insulating elements.

15. A method of manufacturing a display device element substrate according to claim 13, after the step of forming the plurality of transparent electrodes, further comprising the steps of:
  forming a protection layer covering the transparent electrodes
  forming a layer of color filters on the protection layer; and
  wherein the layer of color filters, the protection layer, the plurality of transparent electrodes, the barrier insulating layer, the resin layer, the metal masking layer, and the peelable layer are transferred onto the plastic film via the adhesive layer.

16. A method of manufacturing a display device element substrate according to claim 12, after the step of forming the barrier insulating elements, further comprising the steps of:
  forming an organic EL layer on the plurality of transparent electrodes; and
  forming an upper electrode connected to the organic EL layer.

17. A method of manufacturing a display device element substrate according to claim 12, wherein the transparent electrodes are made of ITO or IZO, and the patterned layer of barrier insulating elements is formed of any one of silicon oxide, silicon nitride, and silicon oxide nitride or stacked films thereof.

18. A display device element substrate according to claim 1, wherein the barrier insulating elements contact and bridge parallel surfaces of adjacent transparent electrodes.

* * * * *